US006351161B2

(12) United States Patent
Schneider et al.

(10) Patent No.: US 6,351,161 B2
(45) Date of Patent: Feb. 26, 2002

(54) INTEGRATED CIRCUIT WITH ACTUATION CIRCUIT FOR ACTUATING A DRIVER CIRCUIT

(75) Inventors: Ralf Schneider; Stephan Schröder, both of München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/816,935

(22) Filed: Mar. 23, 2001

(30) Foreign Application Priority Data

Mar. 23, 2000 (DE) .......................................... 100 14 386

(51) Int. Cl.⁷ .............................. H03B 1/00; H03K 3/00
(52) U.S. Cl. ...................................... 327/108; 327/378
(58) Field of Search ............................. 327/63, 64, 72, 327/78, 79, 82, 90, 108, 141, 142, 144, 172, 176, 291, 378, 383, 384; 365/185.23

(56) References Cited

U.S. PATENT DOCUMENTS

| 4,799,023 | A | | 1/1989 | Firooz et al. ................. 328/110 |
| 5,471,159 | A | | 11/1995 | Stuebing et al. .............. 327/24 |
| 5,959,481 | A | * | 9/1999 | Donnelly et al. ............ 327/170 |
| 6,100,733 | A | * | 8/2000 | Dortu et al. ................. 327/158 |
| 6,160,325 | A | * | 12/2000 | Turvey ........................ 327/479 |
| 6,178,123 | B1 | * | 1/2001 | Kato et al. ................... 365/194 |
| 6,232,801 | B1 | * | 5/2001 | Khoury et al. ................ 327/57 |

FOREIGN PATENT DOCUMENTS

DE 102 027 11/1973

* cited by examiner

*Primary Examiner*—My-Trang Nuton
(74) *Attorney, Agent, or Firm*—Herbert L. Lerner; Laurence A. Greenberg; Werner H. Stemer

(57) ABSTRACT

An integrated circuit includes a terminal supplying a digital signal, a controllable driver circuit connected to the terminal and outputting the digital signal, and a comparator device. An actuating circuit actuates the driver circuit as a function of a clock signal. The comparator device compares the timing of signal transitions of the clock signal with transitions of the digital signal. The comparator has a first comparator input for receiving the clock signal and a second comparator input connected to the driver output for receiving the digital signal. The comparator device outputs an output signal having a first state if a signal transition of the clock signal at the first input takes place before a signal transition of the digital signal at the second input, and outputs a second state if the clock signal transition takes place after digital signal transition. In a test mode, the invention compares the clock and digital signal timings with a high degree of accuracy.

11 Claims, 1 Drawing Sheet

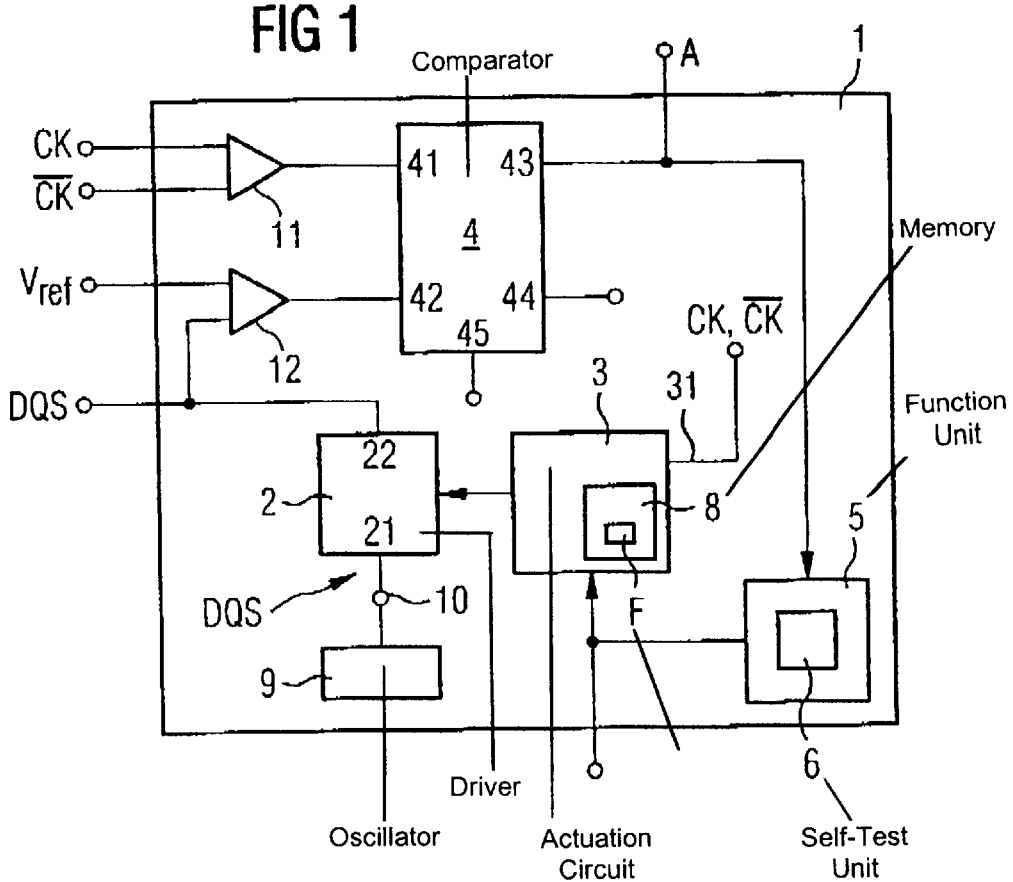
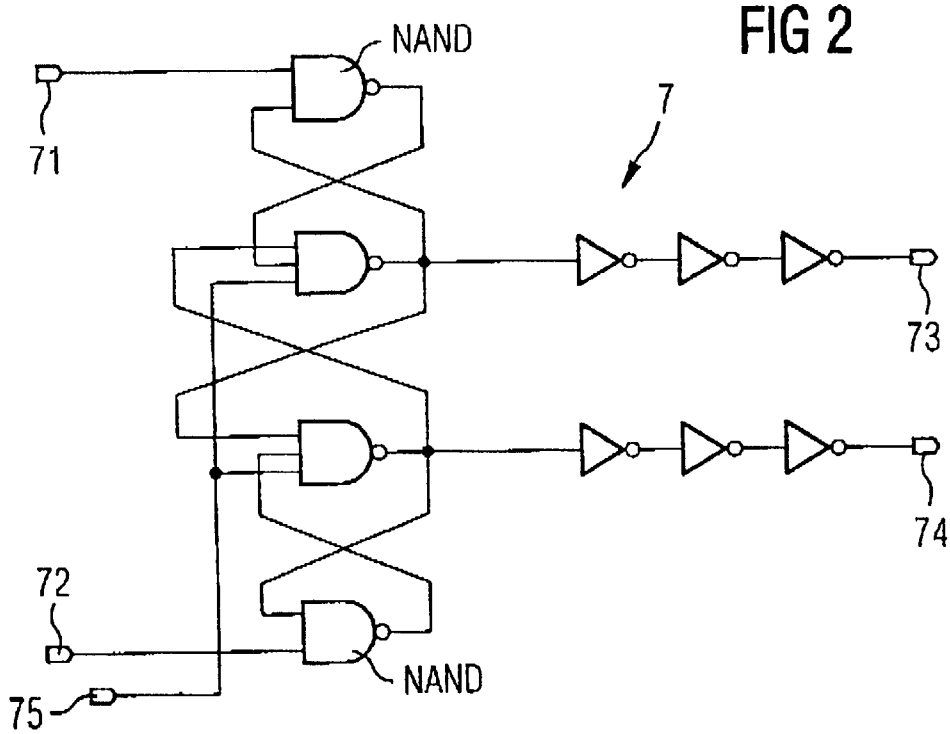

INTEGRATED CIRCUIT WITH ACTUATION CIRCUIT FOR ACTUATING A DRIVER CIRCUIT

BACKGROUND OF THE INVENTION

FIELD OF THE INVENTION

The invention lies in the field of electronic circuits. The invention relates to an integrated circuit with a terminal for a digital signal, a controllable driver circuit having an input connected to the terminal for the digital signal, an output for outputting the digital signal, and an actuation circuit having an input for a clock signal for actuating the driver circuit as a function of the clock signal.

When integrated circuits are operating, it is frequently necessary to generate or adjust a digital signal such that the time of a switching edge of the digital signal is matched to a time of a switching edge of a clock signal. For example, an oscillator circuit generates the digital signal. The frequency of the signal generated by the oscillator circuit is to be set such that it coincides with the frequency of the clock signal as a reference frequency, in particular, with such precision that a phase shift that is present remains the same.

For such a purpose, an integrated circuit has not only a terminal for the digital signal but also, for example, a controllable driver circuit that is connected to the terminal for the digital signal and that is used to output the digital signal. An actuation circuit actuates the driver circuit. The actuation circuit has an input for a clock signal.

The actuation circuit can be set, for example, within a specific range by reference to a reference value to be able, in particular, to compensate influences of process fluctuations and temperature fluctuations. In other words, in the course of the manufacture of such integrated circuits, the respective reference values are each set separately, and, thus, are matched, for each of the integrated circuits. To perform the matching, the reference value is suitably changed such that the different influences are compensated. The actuation circuit is, therefore, trimmed based on the reference value such that the necessary signal synchronization is set.

To set the actuation circuit, the integrated circuit, which is, for example, a component of an integrated memory, is subjected to a test. The test is carried out, for example, externally, using a test system provided for such a purpose. Specifications for setting the actuation circuit are defined by reference to a test result. To set the specifications, the switching edges of the corresponding digital signal and of the clock signal are compared with one another and reconciled in terms of timing by setting the actuation circuit. The achievable precision is generally limited by tolerances of the test system used and of the entire test configuration. Such limitations can result in a necessary product specification of the integrated circuit, and, thus, of the integrated memory, not being fulfilled.

SUMMARY OF THE INVENTION

It is accordingly an object of the invention to provide an integrated circuit with actuation circuit for actuating a driver circuit that overcomes the hereinafore-mentioned disadvantages of the heretofore-known devices of this general type and that, during a test operation, a comparison of the timing of switching edges of the clock signal and of the digital signal can be carried out at the output of the controllable driver circuit with a comparatively high degree of precision.

With the foregoing and other objects in view, there is provided, in accordance with the invention, an integrated circuit, including a terminal for supplying a digital signal, a controllable driver circuit having a driver input connected to the terminal for receiving the digital signal and a driver output for outputting the digital signal, an actuating circuit for actuating the driver circuit as a function of a clock signal, the actuating circuit having an actuating input for receiving the clock signal, and a comparator device having, a first comparator input for receiving the clock signal, a second comparator input connected to the driver output for receiving the digital signal, and a comparator output, the comparator device outputting, from the comparator output, an output signal having a first state if a signal transition of the clock signal at the first comparator input takes place before a signal transition of the digital signal at the second comparator input, and a second state if the signal transition of the clock signal at the first comparator input takes place after the signal transition of the digital signal at the second comparator input.

A comparison of the timing of the signal transitions or switching edges of the digital signal at the output of the driver circuit and of the clock signal is carried out by the comparator device, which is a component of the integrated circuit. The output signal of the comparator device indicates which of the signals at the inputs of the comparator device has a signal transition first. The output signal of the comparator device is present, for example, at a terminal for an external analyzer. At the analyzer, the state of a tapped output signal of the comparator device is analyzed, after which the setting of the actuation circuit can be carried out using the analysis result, as required.

A higher level of measuring accuracy is achieved because the respective signal transitions are not directly measured and analyzed by an external test system during the execution of the comparison of the timing of the digital signal and of the clock signal. The measuring accuracy is not limited by the tolerance of an external test system and of the test configuration as a whole because the measurement is carried out directly on the chip of the integrated circuit.

In accordance with another feature of the invention, corresponding state of the output signal of the comparator device is advantageously stored in the comparator device. As a result, the output signal of the comparator device can be tapped during a relatively long period, for example, by the external analyzer. The output signal of the comparator device also has a static state so that interference effects during the tapping of the output signal do not lead to a significant falsification of the comparison result.

In accordance with yet another feature of the invention, the control function of the actuation circuit can be set, for example, based on a reference value. So that the reference value has to be set only once, it is advantageous that the reference value is stored in a memory unit of the actuation circuit. The memory unit then has, for example, programmable elements in the form of laser fuses or of electrically programmable fuses. To set the reference value, the laser fuses are programmed by a laser cutter.

The integrated circuit is, for example, a component of an integrated memory, for example, of a Synchronous DRAM (SDRAM). In particular, Double-Data-Rate SDRAMs (DDR SDRAMs) have comparatively high switching and access speeds. Such integrated memories usually have not only a clock signal, which is generally supplied externally, but also a data validity signal or data clock signal ("Data Strobe") that is present at an external terminal, for example, for reading out data from the integrated memory. During a read access, the data strobe signal is transmitted to the outside together with data signals from the integrated memory that are to be output.

In accordance with yet an added feature of the invention, there is provided an oscillator circuit connected to the terminal for producing the digital signal.

The switching edges of the data strobe signal are synchronized with the switched edges of the clock signal by a Delay-Locked Loop ("DLL") circuit. The data strobe signal has, for example, a switching edge simultaneously with the clock signal. The DLL circuit is used as an actuation circuit for a driver circuit that outputs the data strobe signal that is produced, for example, by an oscillator circuit and is present at the input of the driver circuit. Through the DLL circuit, a type of internal clock signal is, thus, produced from the external clock signal that is present at the driver circuit. It is, thus, possible to set a specific phase shift of the internal clock signal or of the data strobe signal with respect to the clock signal that is supplied externally.

In accordance with yet a further feature of the invention, the first input of the comparator device is connected to a first setting input of a flipflop circuit and the second input of the comparator device is connected to a second setting input of the flipflop circuit. The output of the comparator device is connected to an output of the flipflop circuit. The output signal of the flipflop circuit, thus, indicates which of the signals at the setting inputs has a signal transition first.

In accordance with an added feature of the invention, the integrated circuit has a function unit that is connected to the output of the comparator device and to the actuation circuit. The function unit is used to set the actuation circuit by reference to the state of the output signal of the comparator device. Accordingly, it is possible to set the actuation circuit by electrical signals, for example. Because the function unit is part of the integrated circuit, it is not necessary to provide any external terminals of the integrated circuit to carry out electrical setting of the actuation circuit. In addition, shorter test times can be achieved because a plurality of circuits can be trimmed in parallel. The function unit can be used to program, for example, electrically programmable fuses that are contained in the actuation circuit.

In accordance with a concomitant feature of the invention, the function unit has a self-test unit with which respectively successive states of the output signal of the comparator device can be analyzed. The self-test unit is also used for incrementally setting the actuation circuit by reference to an analysis result. Consequently, completely independent trimming of the actuation circuit is possible using the self-test unit. The self-test unit is realized here according to the principle of the "built-in self-test" (BIST). The test time of a plurality of integrated circuits that are to be tested can, thus, be significantly shortened. It is possible to trim actuation circuits of a plurality of integrated circuits in parallel.

Other features that are considered as characteristic for the invention are set forth in the appended claims.

Although the invention is illustrated and described herein as embodied in an integrated circuit with actuation circuit for actuating a driver circuit, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 1 is a schematic and block circuit diagram of an embodiment according to the invention; and FIG. 2 is a schematic circuit diagram of the comparator device according to the invention.

DESCRIPTION OF THE PREFERRED EMBODIMENTS

In all the figures of the drawing, sub-features and integral parts that correspond to one another bear the same reference symbol in each case.

Referring now to the figures of the drawings in detail and first, particularly to FIG. 1 thereof, there is shown an embodiment of the integrated circuit according to the invention, which is disposed on a semiconductor chip 1. The integrated circuit is contained in a memory circuit of the DRAM type, for example, in a DDR SDRAM. The integrated memory has a clock signal CK or a clock signal $\overline{CK}$ complementary thereto, which is supplied through an external terminal. In addition, the memory has a data strobe signal DQS that is transmitted to the outside, together with data signals of the memory that are to be output, through an external terminal. The data strobe signal DQS functions as a data validity signal or data clock signal of the memory for reading out data of the memory.

The integrated circuit also has an actuation circuit 3, otherwise referred to as a DLL circuit. The terminal 10 for the signal DQS is connected to an oscillator circuit 9. The actuation circuit 3 has an input 31 for the clock signal CK or $\overline{CK}$. The actuation circuit 3 is used to actuate a controllable driver circuit 2 that has an input 21 connected to the terminal 10 for the signal DQS, and an output 22 for outputting the signal DQS. The actuation circuit 3 produces a type of internal clock signal from the external clock signal CK or $\overline{CK}$ with a specific phase shift with respect thereto.

The driver circuit 2 is, thus, actuated by the internal clock signal. Therefore, signal transitions of the signal DQS are matched to signal transitions of the clock signal CK or $\overline{CK}$ or the signal transitions are synchronized with one another by the actuation circuit 3 or DLL circuit. It is possible to set a specific phase shift of the signal DQS with respect to the clock signal CK or $\overline{CK}$ supplied externally. During a read access, the signal DQS is transmitted to the outside together with data signals of the integrated memory that are to be output.

The integrated circuit according to FIG. 1 also has a comparator device 4 with a first input 41 for the clock signal CK or $\overline{CK}$ and a second input 42 connected to the output 22 of the driver circuit 2. An output 43 of the comparator device 4 is used to output an output signal A. The output signal A has a first stage "H" if a signal transition of the signal at the input 41 takes place before a signal transition of the signal at the input 42. The output signal A correspondingly has a second state "L" if the signal transition of the signal at the input 41 takes place after the signal transition of the signal at the input 42. The comparator device 4 has a further output 44 with a signal indicating the reverse sequence of signal transitions by corresponding states. The comparator device 4 can be reset with a corresponding signal at a terminal 45.

The clock signal CK or $\overline{CK}$ is connected to the input 41 of the comparator device 4 by a differential amplifier 11. The signal DQS is also connected to the input 42 of the comparator device 4 by a differential amplifier 12 at which a reference potential $V_{ref}$ is present.

The integrated circuit also has a function unit 5 that is connected to the output 43 of the comparator device 4 and to the actuation circuit 3. The function unit 5 is used to set the actuation circuit 3 by reference to the state of the output signal A of the comparator device 4. The function unit 5 can set the actuation circuit 3 using an electrical signal.

A reference value is stored in a memory unit 8 in the actuation circuit 3. The control function of the actuation circuit 3 can be set based on the stored reference value. The memory unit 8 has programmable elements F in the form of programmable fuses. If the memory unit 8 is programmed by the function unit 5, the programmable fuses F are suitably embodied as electrically programmable fuses.

In one development of the integrated circuit, the function unit 5 has a self-test unit 6 for analyzing respectively successive states of the output signal A of the comparator device 4. Independent trimming of the actuation circuit 3 is possible using the self-test unit 6. It is no longer necessary to tap the comparison result through an external terminal or to set the actuation circuit 3 through an external terminal. The self-test unit 6 is suitable for performing incremental setting of the actuation circuit 3 by reference to an analysis result.

FIG. 2 illustrates an embodiment of the comparator device 4, which has a flipflop circuit 7 with a first setting input 71 and a second setting input 72. The first setting input 71 is connected to the input 41 of the comparator device 4, and the second setting input 72 is connected to the input 42 of the comparator device 4. The flipflop circuit 7 has a first output 73 that is connected to the output 43 of the comparator device 4. The further output 44 of the comparator device 4 is connected to a second output 74 of the flipflop circuit 7. A resetting input 75 of the flipflop circuit 7 is connected to the terminal 45 of the comparator device 4. The output signal at the first output 73 of the flipflop circuit 7 indicates which of the signals at the setting inputs 71 or 72 has a signal transition first. The respective output signal at the output 73 is stored until the flipflop circuit 7 resets.

We claim:

1. An integrated circuit, comprising:
    a terminal for supplying a digital signal;
    a controllable driver circuit having a driver input connected to said terminal for receiving the digital signal and a driver output for outputting the digital signal;
    an actuating circuit for actuating the driver circuit as a function of a clock signal, said actuating circuit having an actuating input for receiving the clock signal; and
    a comparator device having:
        a first comparator input for receiving the clock signal;
        a second comparator input connected to said driver output for receiving the digital signal; and
        a comparator output,
    said comparator device outputting, from said comparator output, an output signal having:
        a first state if a signal transition of the clock signal at said first comparator input takes place before a signal transition of the digital signal at said second comparator input; and
        a second state if the signal transition of the clock signal at said first comparator input takes place after the signal transition of said digital signal at said second comparator input.

2. The integrated circuit according to claim 1, wherein said comparator device stores the first and second states of said output signal.

3. The integrated circuit according to claim 1, wherein said comparator device includes a flipflop circuit having a first setting input, a second setting input, and a flipflop output;
    said first comparator input connected to said first setting input;
    said second comparator input connected to said second setting input;
    said comparator output connected to said flipflop output; and
    said comparator device programmed to produce the output signal indicating which of said first comparator input and said second comparator input receives a signal transition first.

4. The integrated circuit according to claim 1, further including a function unit connected to said comparator output and to said actuation circuit, said function unit programmed to set a control function of said actuation circuit based upon a state of said output signal.

5. The integrated circuit according to claim 4, wherein said function unit has a self-test unit for analyzing respectively successive states of said output signal, said self-test unit programmed to incrementally set said actuation circuit based upon a result of the analysis.

6. The integrated circuit according to claim 1, wherein said actuation circuit has a control function to be set based on a reference value, and a memory unit for storing said reference value.

7. The integrated circuit according to claim 6, wherein said memory unit has programmable elements.

8. The integrated circuit according to claim 7, wherein said programmable elements are programmable fuses.

9. The integrated circuit according to claim 1, further including an oscillator circuit connected to said terminal for producing the digital signal.

10. In a DRAM memory circuit, an integrated circuit comprising:
    a terminal for supplying a digital signal;
    a controllable driver circuit having a driver input connected to said terminal for receiving the digital signal and a driver output for outputting the digital signal;
    an actuating circuit for actuating the driver circuit as a function of a clock signal, said actuating circuit having an actuating input for receiving the clock signal; and
    a comparator device having:
        a first comparator input for receiving the clock signal;
        a second comparator input connected to said driver output for receiving the digital signal; and
        a comparator output,
    said comparator device outputting, from said comparator output, an output signal having:
        a first state if a signal transition of the clock signal at said first comparator input takes place before a signal transition of the digital signal at said second comparator input; and
        a second state if the signal transition of the clock signal at said first comparator input takes place after the signal transition of said digital signal at said second comparator input.

11. The integrated circuit according to claim 10, wherein the digital signal includes a data validity signal and a data clock signal for reading out data from the DRAM memory circuit.

* * * * *